(12) United States Patent
Suzuki et al.

(10) Patent No.: US 9,257,650 B2
(45) Date of Patent: Feb. 9, 2016

(54) METHOD FOR PRODUCING DISPLAY DEVICE

(71) Applicant: Japan Display Inc., Tokyo (JP)

(72) Inventors: Takayasu Suzuki, Tokyo (JP); Norio Oku, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/660,118

(22) Filed: Mar. 17, 2015

(65) Prior Publication Data

US 2015/0280127 A1 Oct. 1, 2015

(30) Foreign Application Priority Data

Mar. 31, 2014 (JP) .................................. 2014-071677

(51) Int. Cl.
*H01L 21/00* (2006.01)
*H01L 51/00* (2006.01)
*H01L 27/32* (2006.01)
*H01L 51/56* (2006.01)

(52) U.S. Cl.
CPC .......... *H01L 51/003* (2013.01); *H01L 27/3248* (2013.01); *H01L 51/0097* (2013.01); *H01L 51/56* (2013.01); *H01L 51/0034* (2013.01); *H01L 2251/5338* (2013.01)

(58) Field of Classification Search
CPC ... H01L 51/003; H01L 51/56; H01L 51/0097; H01L 27/3248
See application file for complete search history.

(56) References Cited

U.S. PATENT DOCUMENTS

| | | | | |
|---|---|---|---|---|
| 7,542,647 B2* | 6/2009 | Ohtsu | ...................... | G02B 6/43 385/129 |
| 7,566,635 B2* | 7/2009 | Fujii | .................. | B23K 26/0057 257/E21.596 |
| 7,620,285 B2* | 11/2009 | Suzuki | .................... | G02B 6/138 385/129 |
| 7,956,537 B2* | 6/2011 | Nakadaira | ........... | H01L 51/5237 313/498 |
| 8,759,126 B2* | 6/2014 | Kuranaga | .......... | G02F 1/133351 257/88 |
| 8,934,965 B2* | 1/2015 | Rogers | .................. | A61B 5/0478 600/378 |
| 9,012,928 B2* | 4/2015 | Sugizaki | ............. | H01L 25/0753 257/88 |
| 9,146,416 B2* | 9/2015 | Yoneyama | ........ | G02F 1/133512 |
| 2005/0112805 A1* | 5/2005 | Goto | ................... | H01L 27/1214 438/149 |
| 2006/0198576 A1* | 9/2006 | Furusawa | ........... | G02B 6/29367 385/24 |
| 2008/0252839 A1* | 10/2008 | Nakadaira | ........... | H01L 51/5237 349/153 |
| 2009/0256993 A1* | 10/2009 | Oku | ...................... | G02B 5/0215 349/61 |
| 2011/0062479 A1* | 3/2011 | Sugano | ............... | H01L 33/0095 257/98 |
| 2012/0261700 A1* | 10/2012 | Ooyabu | .................. | H01L 33/46 257/98 |
| 2012/0262054 A1* | 10/2012 | Ooyabu | .................. | H01L 33/56 313/498 |
| 2012/0285501 A1* | 11/2012 | Zhao | .................... | H01L 31/0516 136/244 |
| 2013/0160290 A1* | 6/2013 | Maeda | ..................... | H05K 3/10 29/846 |
| 2013/0248893 A1* | 9/2013 | Sugizaki | ............. | H01L 25/0753 257/88 |
| 2015/0192951 A1* | 7/2015 | Chong | .................. | G06F 1/1601 359/894 |
| 2015/0214502 A1* | 7/2015 | Sato | .................... | H01L 51/5237 257/88 |

FOREIGN PATENT DOCUMENTS

JP 2011-227369 A 11/2011

* cited by examiner

*Primary Examiner* — Laura Menz
(74) *Attorney, Agent, or Firm* — Lowe Hauptman & Ham, LLP

(57) ABSTRACT

A method for producing a display device includes forming a resin film on a substrate, forming a plurality of light emitting elements above the resin film, forming a plurality of first grooves in a surface of the resin film, the plurality of first grooves enclosing the plurality of light emitting elements individually in a multiple-fold manner, cutting the substrate at a position overlapping any one of the plurality of first grooves other than the first groove closest to one of the plurality of light emitting elements, and peeling off the substrate from the resin layer.

9 Claims, 15 Drawing Sheets

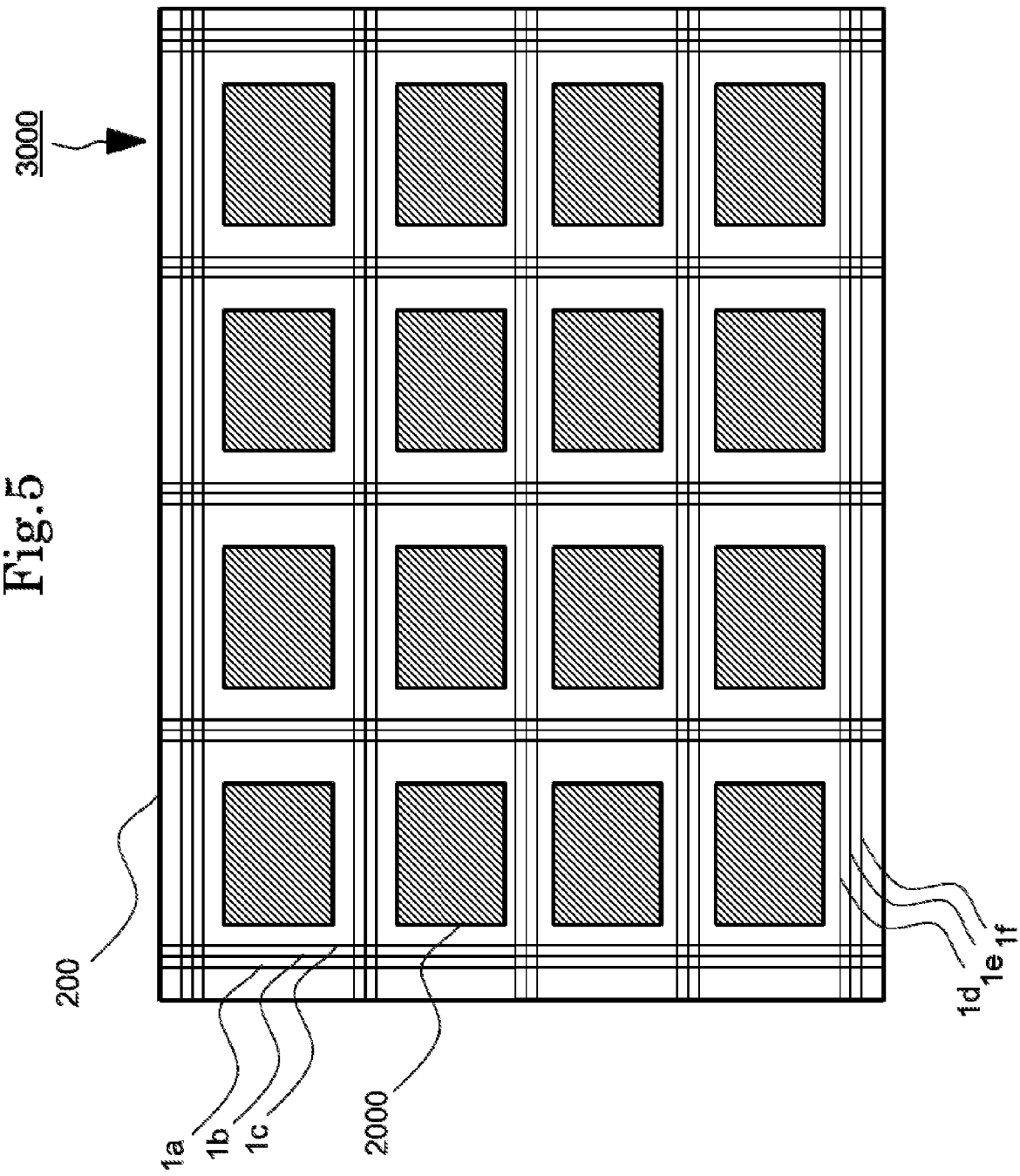

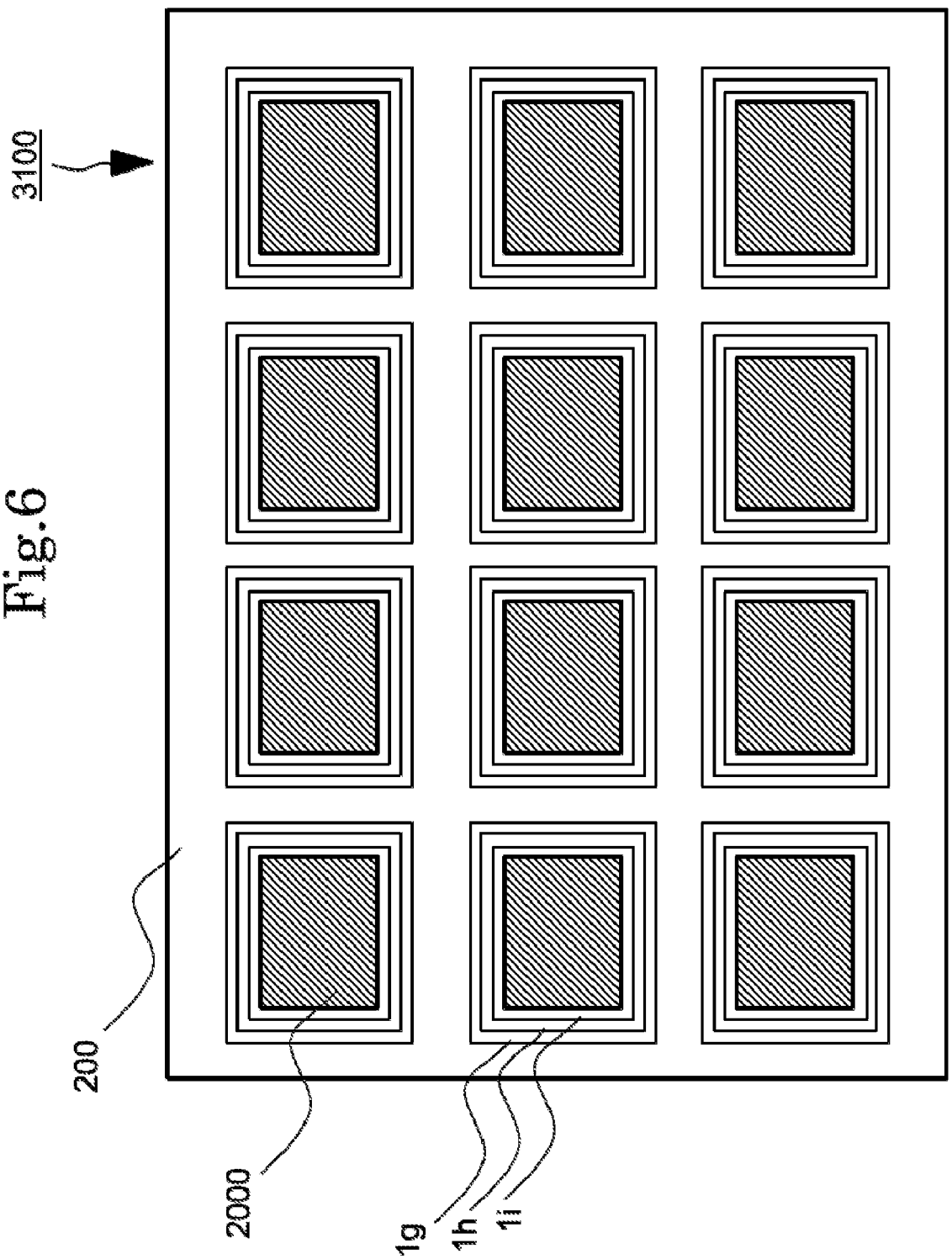

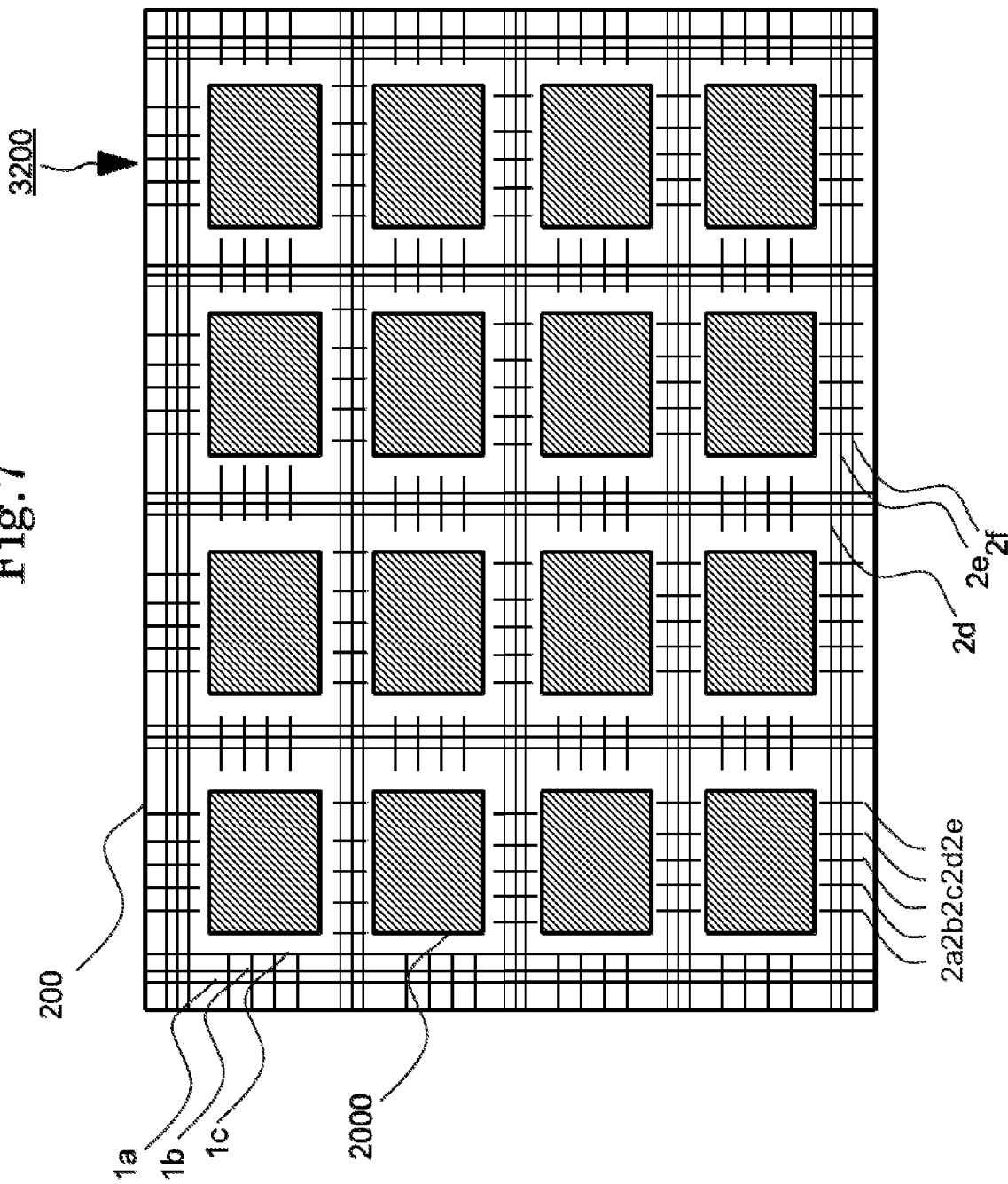

METHOD FOR PRODUCING DISPLAY DEVICE

CROSS REFERENCE TO RELATED APPLICATIONS

This application is based upon and claims the benefit of priority from the prior Japanese Patent Application No. 2014-071677, filed on 31 Mar. 2014, the entire contents of which are incorporated herein by reference.

FIELD

The present invention relates to a display device and a method for producing the same, and specifically to a sheet display device including a panel using a resin film as a substrate.

BACKGROUND

In general, in order to form a large number of sheet display devices such as organic EL display devices or the like by use of a mother substrate, the following method is used. A resin film formed of polyimide or the like is formed on the mother substrate, and a plurality of organic EL elements including a plurality of thin film transistors (TFTs), a light emitting layer and a gas barrier layer are formed on the resin film. Then, the substrate is cut into a plurality of substrate portions by a glass scribe method or the like, and the resin film is peeled off from the substrate portions to produce a plurality of organic EL display devices. As such a mother substrate, a glass substrate is used, for example.

However, the resin film is thin and elastic, and cannot be easily cut together with the glass substrate by the glass scribe method. It is not easy either to peel off the resin film from the glass substrate. Therefore, there is a problem that in a step of cutting the glass substrate or a step of peeling off the resin film from the glass substrate, the resin film formed on the glass substrate is pulled, which damages the TFTs and the organic EL elements formed on the resin film.

In addition, it is difficult to make small the tolerance for the cutting position at which the glass substrate is to be cut. For these reasons, a production method capable of enlarging the margin for the cutting position of the glass substrate and thus providing a high yield is desired.

According to an existing method proposed for this purpose, a groove is formed by laser light in a resin film along a line along which the glass substrate is to be cut before the glass substrate is actually cut, and then a scribing unit is directed to the groove formed on the resin film in order to cut the glass substrate by the scribe method.

With reference to FIG. 1 and FIG. 2, an example of such a method for producing a conventional organic EL display device will be described. As shown in FIG. 1A, a first resin film 20 is formed on a first glass substrate 10, which is a TFT-side mother substrate. An organic EL layer 40, a sealing member 44, a filling member 42, a line 30 and the like are formed on the first resin film 20. A second resin film 22 is formed on a second glass substrate 12, which is a counter substrate-side mother substrate. On the second resin film 22, a gas barrier layer 24 may be formed. Although not shown, a gas barrier layer may also be formed on the first resin film 20.

From the structure shown in FIG. 1A, individual organic EL display devices are produced as follows, for example. First, from the state shown in FIG. 1A, an interface between the second glass substrate 12 and the second resin film 22 is irradiated with laser light to remove the second glass substrate 12.

Next, as shown in FIG. 1B, the first resin film 20 and the second resin film 22 are irradiated with light from a solid UV laser to cut the first resin film 20 and the second resin film 22.

Next, as shown in FIG. 10, an excessive portion of the first resin film 20 and the second resin film 22 is removed.

Next, as shown in FIG. 2A and FIG. 2B, an excessive portion of the first glass substrate 10 (on the TFT side) is cut away by the glass scribe method.

Next, an interface between the first glass substrate 10 and the first resin film 20 is irradiated with laser light to remove the first glass substrate 10.

As a result, individual organic EL display devices 1000 as shown in FIG. 2C are produced.

For example, Japanese Laid-Open Patent Publication No. 2011-227369 describes the following. In a resin film provided on a mother substrate, one groove along which the resin film is to be cut is formed. After the mother substrate is peeled off, a plastic substrate is bonded to the resin film. Then, the plastic substrate is cut along the groove formed in the resin film.

According to this method, only one groove is formed in the resin film. Therefore, there is a problem that in the case where the cutting position at which the glass substrate is cut is offset, the resin film is pulled, which may damage display elements formed on the resin film.

SUMMARY

A method for producing a display device according to the present invention includes forming a resin film on a substrate; forming a plurality of light emitting elements above the resin film; forming a plurality of first grooves in a surface of the resin film, the plurality of first grooves enclosing the plurality of light emitting elements individually in a multiple-fold manner; cutting the substrate at a position overlapping any one of the plurality of first grooves other than the first groove closest to one of the plurality of light emitting elements; and peeling off the substrate from the resin layer.

In the method for producing a display device according to the present invention, the plurality of first grooves may be formed in a lattice pattern enclosing the light emitting elements individually in a multiple-fold manner.

In the method for producing a display device according to the present invention, the plurality of first grooves may be formed in a rectangular or square pattern enclosing the light emitting elements individually in a multiple-fold manner.

The method for producing a display device according to the present invention may further include forming a plurality of second grooves substantially perpendicular to the plurality of first grooves.

The method for producing a display device according to the present invention may further include forming a gas barrier layer on the resin film.

In the method for producing a display device according to the present invention, a member including a SiN layer and a $SiO_2$ layer stacked in this order may be formed as the gas barrier layer on the resin film.

In the method for producing a display device according to the present invention, a member including a $SiO_2$ layer, a SiN layer and another $SiO_2$ layer stacked in this order may be formed as the gas barrier layer on the resin film.

In the method for producing a display device according to the present invention, the resin film may be a polyimide film.

The method for producing a display device according to the present invention may further include forming a flexible printed circuit connected to the TFT layer.

The method for producing the organic EL display device according to the present invention having the above-described structure allow the margin for a cutting position of the substrate to be enlarged and thus prevent display elements from being damaged in the step of cutting the substrate.

BRIEF EXPLANATION OF DRAWINGS

FIG. 5 is a schematic plan view provided to show a step shown in FIG. 4A in an example of method for producing the organic EL display device according to the present invention;

FIG. 6 is a schematic plan view provided to show a step shown in FIG. 4A in another example of method for producing the organic EL display device according to the present invention; and FIG. 7 is a schematic plan view provided to show a step shown in FIG. 4A in still another example of method for producing the organic EL display device according to the present invention.

DESCRIPTION OF EMBODIMENTS

The present invention has an object of providing a method for producing a display device by which a margin for a cutting position of a substrate is enlarged and thus display elements are prevented from being damaged in a step of cutting the substrate.

Hereinafter, a method for producing an organic EL display device in each of embodiments according to the present invention will be described with reference to the drawings. The present invention is not limited to any of the following embodiments, and may be carried out in any of various embodiments without departing from the gist thereof.

Embodiment 1

Figure 1A:
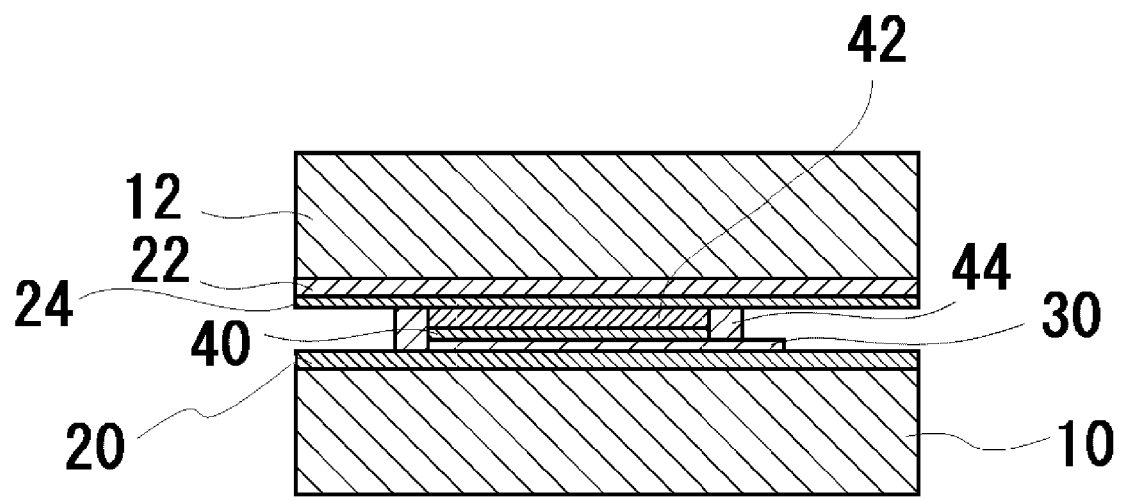
FIG. 1A through FIG. 1C are each a schematic cross-sectional view provided to describe a method for producing a conventional organic EL display device.
Figure 1B:
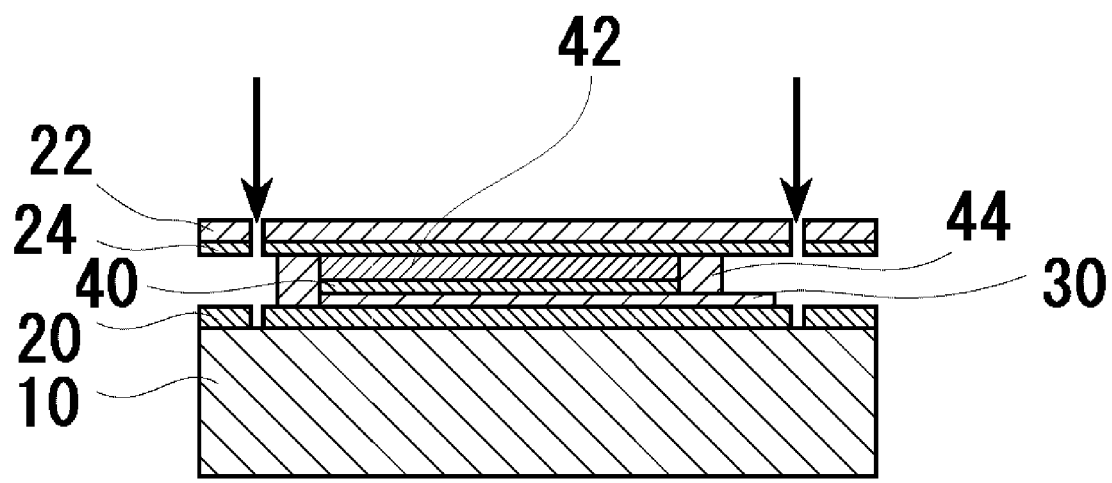
Figure 1C:
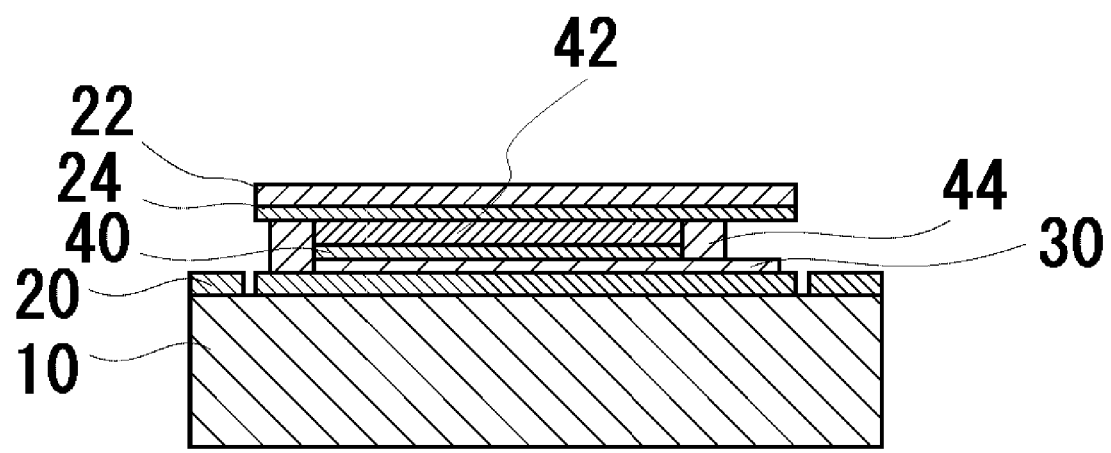
Figure 2A:
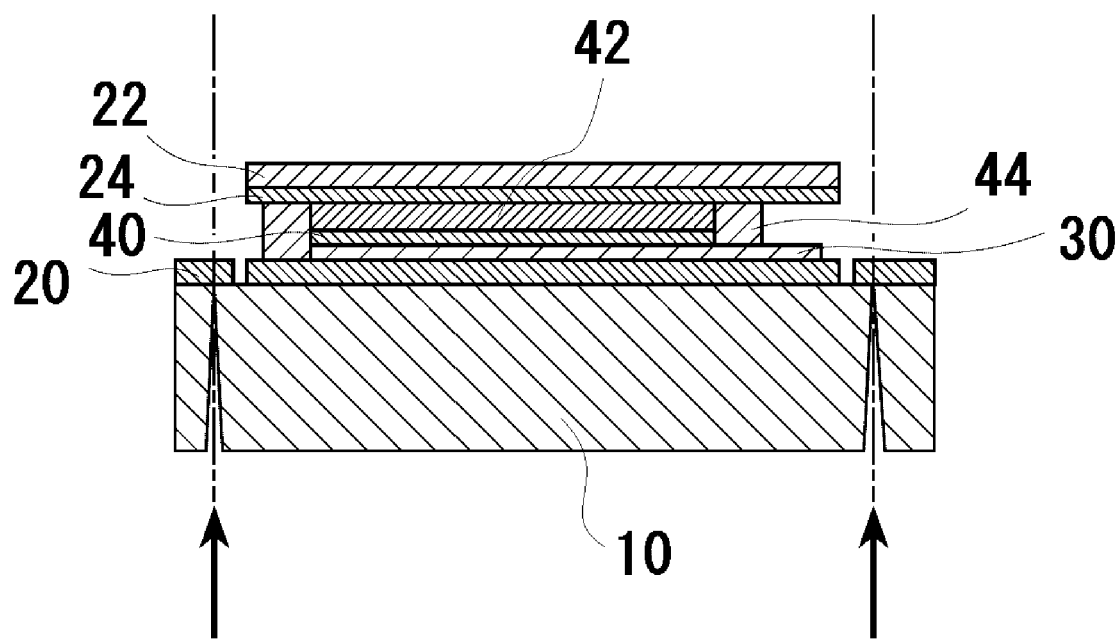
FIG. 2A through FIG. 2C are each a schematic cross-sectional view provided to describe the method for producing the conventional organic EL display device.
Figure 2B:
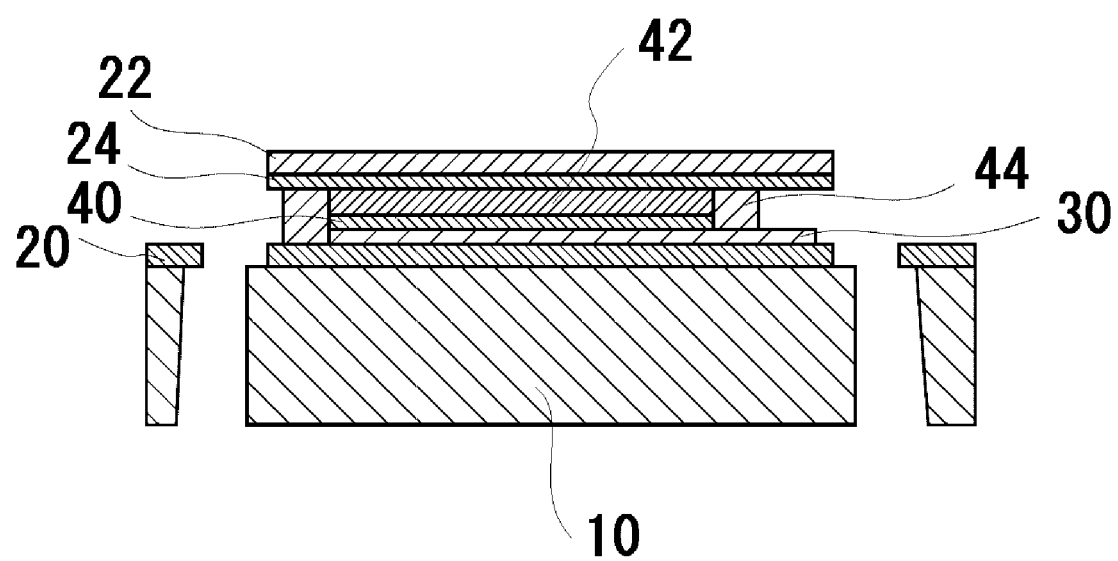
Figure 2C:
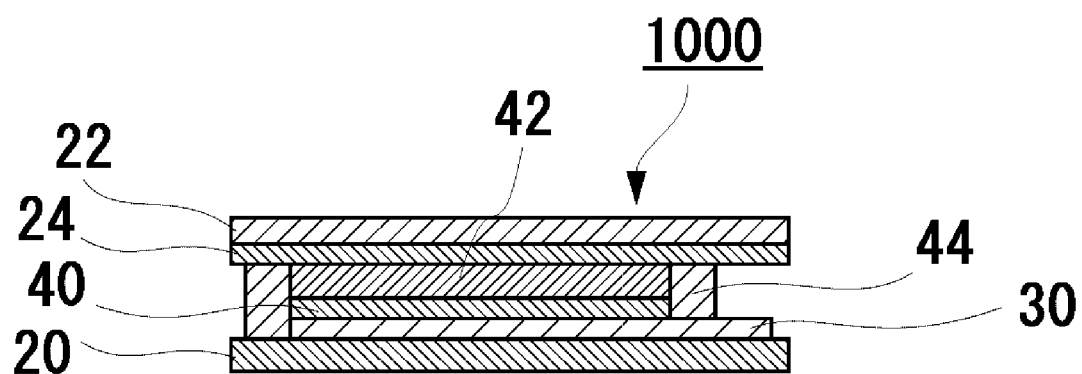
Figure 3A:
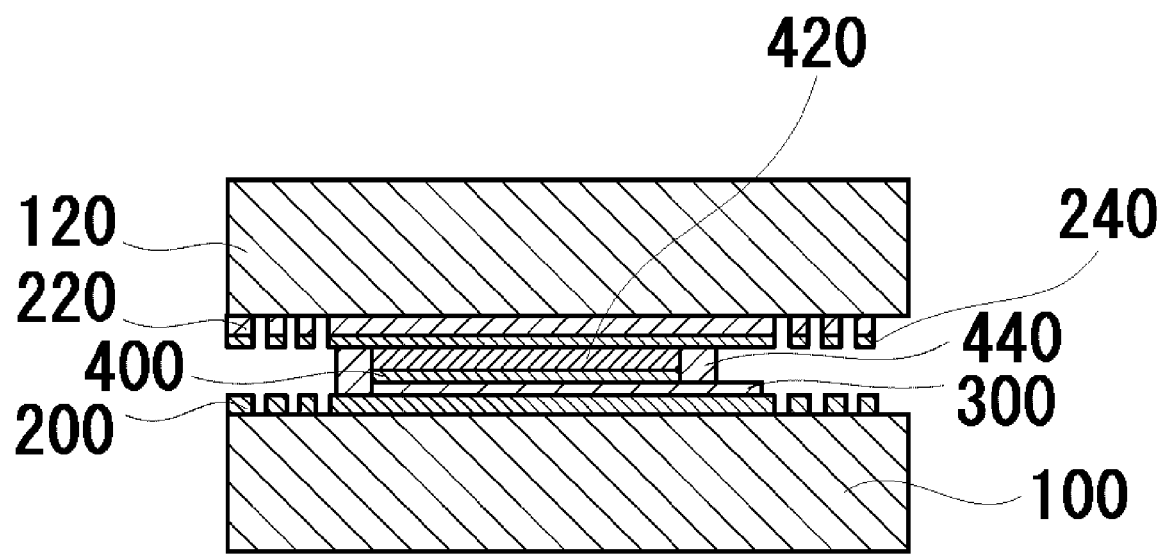
FIG. 3A through FIG. 3C are each a schematic cross-sectional view provided to describe a method for producing an organic EL display device according to the present invention.
Figure 3B:
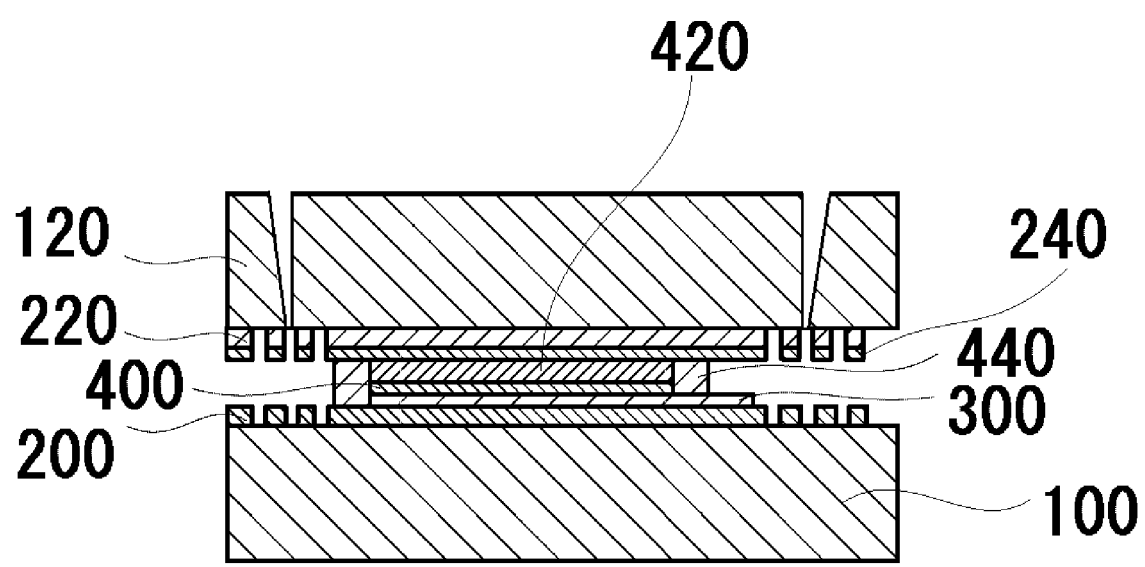
Figure 3C:
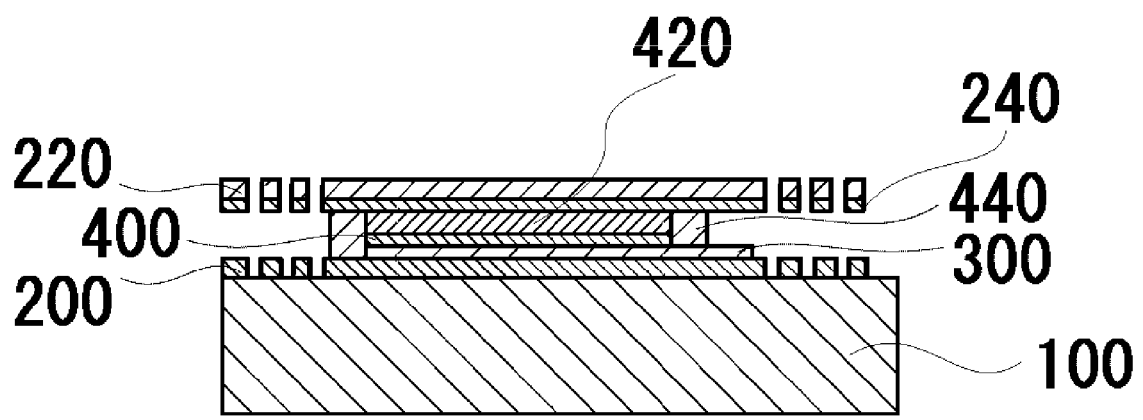
Figure 4A:
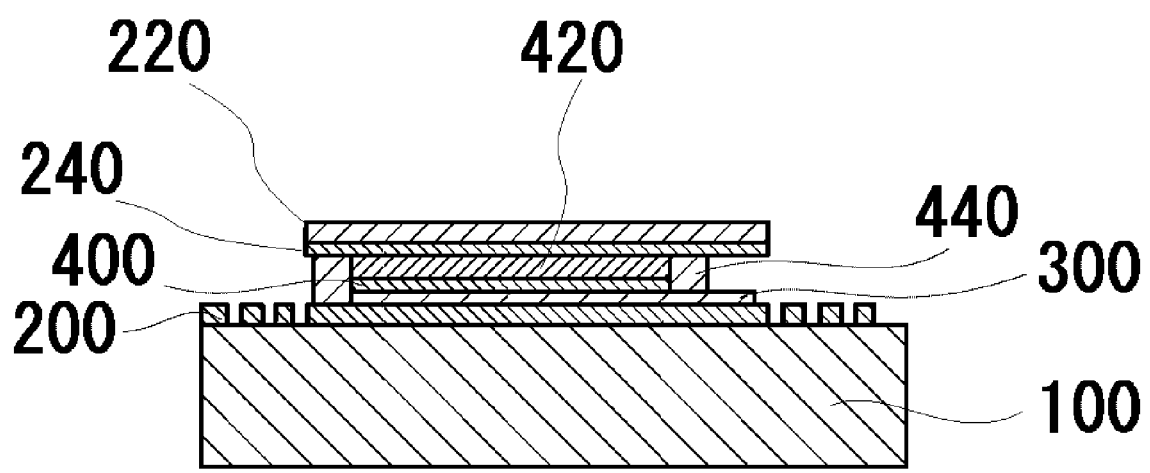
FIG. 4A through FIG. 4C are each a schematic cross-sectional view provided to describe the method for producing the organic EL display device according to the present invention.

With reference to FIG. 3 through FIG. 7, embodiment 1 according to the present invention will be described. FIG. 3 and FIG. 4 show schematic cross-sectional views provided to describe a method for producing an organic EL display device according to the present invention. FIG. 5 through FIG. 7 are each a schematic plan view of a mother substrate in a step shown in FIG. 4A in an example of method for producing the organic EL display device according to the present invention.

In this embodiment, as shown in FIG. 3A, a first resin film 200 and a second resin film 220 are respectively formed on a first glass substrate 100 and a second glass substrate 200. On the second resin film 220, a gas barrier layer 240 is formed. Although not shown, a gas barrier layer may also be formed on the first resin film 200. Between the first resin film 200 and the second resin film 220, an organic EL layer 400, a sealing member 440, a filling member 420, a line 300 and the like, which are included in a plurality of organic EL display devices, are formed.

A specific structure of the gas barrier layer 240 is not shown. For example, the gas barrier layer 240 may include a SiN layer and a first $SiO_2$ layer stacked in this order from the side of the second resin film 220. Alternatively, the gas barrier layer 240 may include a second $SiO_2$ layer, a SiN layer and a first $SiO_2$ layer stacked in this order from the side of the second resin film 220.

A specific structure of the organic EL layer 400 is not shown. The organic EL layer 400 may roughly include a layer in which a TFT (thin film transistor) is to be formed (TFT layer) and a layer in which an organic light emitting diode is to be formed (OLED layer). In this embodiment, the OLED layer corresponds to an organic EL element. The TFT layer may be formed, for example, by a usual LTPS (Low Temperature Poly-Silicon) method. A semiconductor layer used for the TFT layer may be formed of amorphous silicon, an oxide semiconductor, or an organic semiconductor.

The first glass substrate 100 and the second glass substrate 200 are each a mother substrate, and can have a plurality of organic EL display devices formed thereon. The first glass substrate 100 is a mother substrate on the side where the TFT is formed, and the second glass substrate 200 is a mother substrate on the side where a counter substrate is formed. In FIG. 3A, a pair of mother substrates, more specifically, the first glass substrate 100 and the second glass substrate 200, are used for the production of the organic EL display devices. Alternatively, the second glass substrate 200 may be omitted.

The first resin film 200 and the second resin film 220 may be each, for example, a polyimide film. Polyimide withstands a process temperature used for forming a TFT thereon by the LTPS (Low Temperature Poly-Silicon) method or the like, and thus is preferable as a material of the resin films 200 and 220 according to the present invention.

In a step shown in FIG. 3A, the first resin 200 and the second resin film 220 are irradiated with laser light to form a plurality of grooves. A preferable processing precision at which the plurality of grooves are formed in the first resin film 200 and the second resin film 220 by laser light is 0.1 mm to 0.3 mm.

The plurality of grooves formed in the first resin film 200 and the second resin film 220 may be of any pattern that encloses the plurality of organic EL display devices individually in a multiple-fold manner.

For example, as in a mother substrate 3000 shown in FIG. 5, the plurality of grooves may include a plurality of sets of first grooves, each of the sets including three first grooves 1a, 1b and 1c generally parallel to one another, and a plurality of sets of first grooves, each of the sets including three first grooves 1d, 1e and 1f generally perpendicular to the first grooves 1a, 1b and 1c. The sets of first grooves 1a, 1b and 1c and the sets of first grooves 1d, 1e and 1f may be provided in a lattice pattern so as to enclose the organic EL display devices individually in a multiple-fold manner.

As in a mother substrate 3100 shown in FIG. 6, the plurality of grooves may include a plurality of sets of first grooves, each of the sets including three first grooves 1g, 1h and 1i. The three first grooves 1g, 1h and 1i may be of rectangular or square patterns similar to one another with different sizes, and the sets of first grooves 1g, 1h and 1i may enclose the organic EL display devices individually in a multiple-fold manner.

As in a mother substrate 3200 shown in FIG. 7, the plurality of grooves may include a plurality of sets of three first grooves 1a, 1b and 1c and a plurality of sets of three first grooves 1d, 1e and 1f that are provided in a lattice pattern so as to enclose the organic EL display devices individually as shown in FIG. 5, and may also include a plurality of sets of second grooves substantially perpendicular to the first grooves. For example, each of the sets may include second grooves 2a, 2b, 2c, 2d and 2e that are substantially perpendicular to the first grooves 1a, 1b, 1c, 1d, 1e and 1f.

In this embodiment, as shown in FIG. 5 through FIG. 7, a plurality of grooves are formed in the glass substrate, and the glass substrate is cut along a cutting line, which is any of the grooves other than the groove closest to each of the organic EL display devices. As a result, even if there is a variance in actual cutting lines used to cut the glass substrate by the glass scribe method or the like, for example, even if an actual cutting line is offset toward the organic EL display device (inward), the resin film has at least one groove inner to the actual cutting line (on the side of the organic EL display device). Therefore, the damage caused when the glass substrate is cut is absorbed by the groove(s) provided inner to the cutting line and does not influence an area inner to such groove(s). Thus, the margin for the cutting position of the glass substrate is enlarged. In addition, the display elements are suppressed from being damaged in the step of cutting the glass substrate.

As shown in FIG. 7, the second grooves are provided. In this structure, the first grooves are divided into short portions by the second grooves. Therefore, even if in a step of irradiating the surface of the resin film with laser light to form the plurality of first grooves, the amount of the laser light is insufficient and thus a part of the first grooves is not sufficiently deep, the damage caused by cutting the glass substrate by the glass scribe method does not influence an area of the resin film that is other than the short portions of the first grooves separated from each other by the second grooves.

In this manner, the plurality of grooves is formed in the first resin film 200 and the second resin film 220. Next, in a step shown in FIG. 3B, the second glass substrate 120 on the counter substrate side is cut by the glass scribe method to remove an excessive portion of the second glass substrate 120.

Then, in the step shown in FIG. 3B, an interface between the second glass substrate 120 on the counter substrate side and the second resin film 220 is irradiated with laser light to peel off the second glass substrate 120.

As shown in FIG. 3C, the second glass substrate 120, which has been peeled off, is removed.

Next, as shown in FIG. 4A, an excessive portion of the second resin film 220 is removed.

Figure 4B:
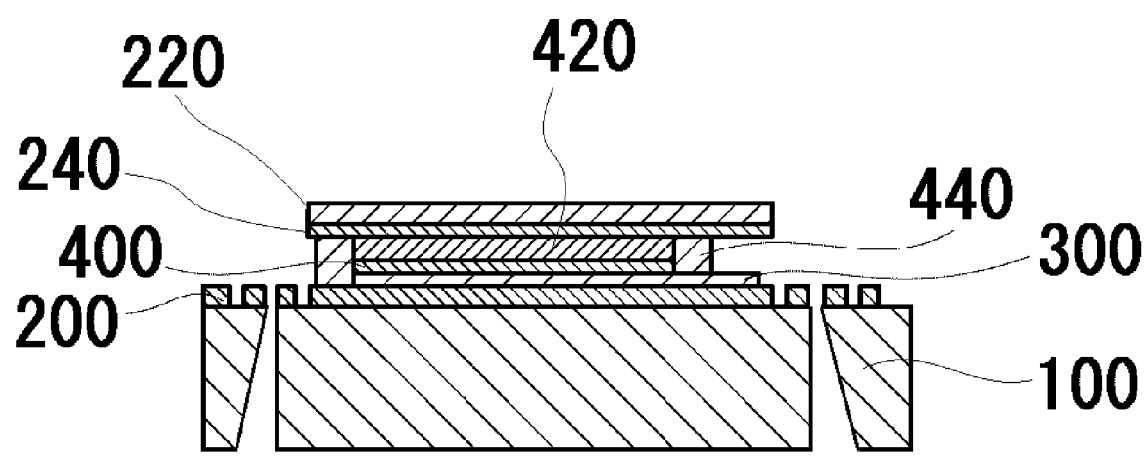
Figure 4C:
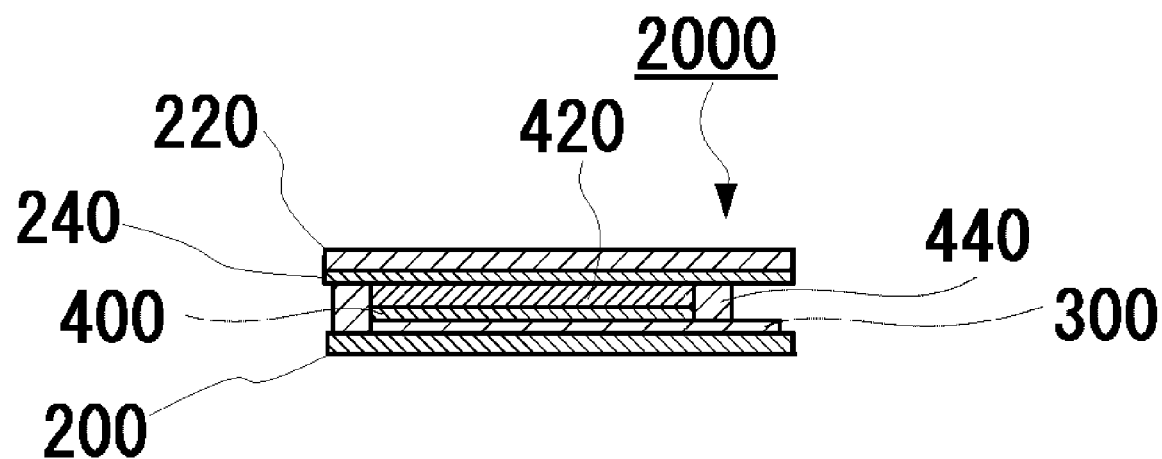

Next, as shown in FIG. 4B and FIG. 4C, a scribing unit is directed to any of the plurality of first grooves other than the innermost first groove in order to cut the first glass substrate 100 on the TFT side by the scribe method. Then, an interface between the first glass substrate 100 and the first resin film 200 is irradiated with laser light to peel off the first glass substrate 100. The first glass substrate 100 and an excessive portion of the first resin film 200 are removed.

As a result, organic EL display devices 2000 as shown in FIG. 4C are produced.

According to the organic EL display device and the method for producing the same in this embodiment described above, a plurality of grooves are formed in the resin film and the substrate is cut along a cutting line, which is any of the plurality of grooves other than the groove closest to the organic EL display device. Therefore, even if there is a variance in actual cutting lines used to cut the glass substrate by the glass scribe method or the like, for example, even if an actual cutting line is offset toward the organic EL display device (inward), the resin film has at least one groove inner to the actual cutting line (on the side of the organic EL display device). Therefore, the damage caused when the glass substrate is cut is absorbed by the groove(s) provided inner to the cutting line and does not influence an area inner to such groove(s). Thus, the margin for the cutting position of the glass substrate is enlarged. In addition, the display elements are suppressed from being damaged in the step of cutting the glass substrate. In this manner, the organic EL display device and the method for producing the same in this embodiment allow the margin for a cutting position of the substrate to be enlarged and thus prevent the display elements from being damaged in the step of cutting the substrate.

Embodiment 2

In embodiment 2 according to the present invention, the TFT layer included in the organic EL layer 400 is connected to a flexible printed circuit (FPC).

The other elements and effects of embodiment 2 according to the present invention are substantially the same as those of embodiment 1 described above and will not be repeated.

The invention claimed is:

1. A method for producing a display device, comprising:
   forming a resin film on a substrate;
   forming a plurality of light emitting elements above the resin film;
   forming a plurality of first grooves in a surface of the resin film, the plurality of first grooves enclosing the plurality of light emitting elements individually in a multiple-fold manner;
   cutting the substrate at a position overlapping any one of the plurality of first grooves other than the first groove closest to one of the plurality of light emitting elements; and
   peeling off the substrate from the resin layer.

2. The method for producing a display device according to claim 1, wherein the plurality of first grooves are formed in a lattice pattern enclosing the light emitting elements individually in a multiple-fold manner.

3. The method for producing a display device according to claim 1, wherein the plurality of first grooves are formed in a rectangular or square pattern enclosing the light emitting elements individually in a multiple-fold manner.

4. The method for producing a display device according to claim 1, further comprising forming a plurality of second grooves substantially perpendicular to the plurality of first grooves.

5. The method for producing a display device according to claim 1, further comprising forming a gas barrier layer on the resin film.

6. The method for producing a display device according to claim 5, wherein a member including a SiN layer and a $SiO_2$ layer stacked in this order is formed as the gas barrier layer on the resin film.

7. The method for producing a display device according to claim 5, wherein a member including a $SiO_2$ layer, a SiN layer and another $SiO_2$ layer stacked in this order is formed as the gas barrier layer on the resin film.

8. The method for producing a display device according to claim 1, wherein the resin film is a polyimide film.

9. The method for producing a display device according to claim 1, further comprising connecting a flexible printed circuit connected to the TFT layer.

* * * * *